United States Patent [19]
Cook et al.

[11] 4,097,753
[45] Jun. 27, 1978

[54] COMPARATOR CIRCUIT FOR A C-2C A/D AND D/A CONVERTER

[75] Inventors: Peter William Cook, Mount Kisco; James Thomas Parrish, Carmel; Stanley Everett Schuster, Granite Springs, all of N.Y.

[73] Assignee: International Business Machines Corporation, Armonk, N.Y.

[21] Appl. No.: 673,178

[22] Filed: Apr. 2, 1976

[51] Int. Cl.$^2$ ............................................. H03K 5/20
[52] U.S. Cl. ............................. 307/359; 307/DIG. 3; 328/162; 340/347 AD; 340/347 CC; 365/45; 365/210; 365/228
[58] Field of Search ......... 307/DIG. 3, 235 F, 235 K, 307/238; 340/347 M, 347 CC, 347 AD; 328/162, 165

[56] References Cited

U.S. PATENT DOCUMENTS

| | | | |
|---|---|---|---|
| 3,573,794 | 4/1971 | Widenor | 340/347 M |
| 3,811,125 | 5/1974 | Schumann | 340/347 AD |
| 3,908,181 | 9/1975 | Shigaki et al. | 340/347 AD |
| 3,916,314 | 10/1975 | Franaszek et al. | 329/104 |

Primary Examiner—John Zazworsky
Assistant Examiner—Marcus S. Rasco
Attorney, Agent, or Firm—Philip Young

[57] ABSTRACT

A comparator circuit for comparing two voltage levels in a C-2C A/D and D/A converter, comprising four cross-coupled active devices (FETs) in a latch arrangement whereby an offset voltage is used to compensate for imbalances in the comparator. The comparator includes a first FET having its gate electrode connected to the output of the D/A converter, and a second FET having its gate electrode connected to an analog input voltage. The first and second FETs each have one of their electrodes connected to a common voltage source. A third and a fourth FET have one of their electrodes connected respectively to the other electrode of the first and second FETs at first and second common nodes, respectively. The output of the comparator is provided at one of such first and second common nodes. The first and second nodes are also respectively connected to the gate electrodes of the fourth and third FETs in a cross-coupled arrangement. The other electrode of both the third and fourth FETs are connected to a common phase voltage source. An offset voltage is generated at the input to either of the gate electrodes of the first and second FETs to set the comparator at a balance point and thereby compensate for the differences in the threshold voltages and current carrying capabilities of the four FETs. Also, the comparator has relatively high input impedance, gain and bandwidth.

13 Claims, 11 Drawing Figures

THÉVENIN EQUIVALENT

COMPARATOR CIRCUIT FOR A C-2C A/D AND D/A CONVERTER

BACKGROUND OF THE INVENTION

1. Field of the Invention

The present invention generally relates to analog-to-digital and digital-to-analog converter circuits, and more particularly, to a comparator circuit used with such converter circuits.

2. Description of the Prior Art

Capacitor ladder networks have been used in A/D and D/A converters and offer the advantages of lower cost and higher speed of operation. An example of such a capacitor ladder network is disclosed in U.S. Pat. No. 3,665,458 to Mulkey et al. Mulkey et al disclose a capacitor ladder switching network which may be fabricated using thin film techniques; but while a distinct improvement over prior art resistor ladder network, the Mulkey et al capacitor ladder network is not compatible with integrated circuit fabrication techniques and has no provision for trimming or adjustment.

In U.S. Patent Application Ser. No. 585,629, now U.S. Pat. No. 4,028,694, filed on June 10, 1975, by P. W. Cook and S. E. Schuster for "C-2C A/D and D/A Converter", there are disclosed A/D and D/A converters employing a capacitor ladder network which may be manufactured using monolithic, integrated circuit fabrication techniques and which can be trimmed electrically. The capacitor ladder network is formed as a multilayer structure that includes a substrate, diffusion regions in the substrate, a polysilicon layer and an aluminum layer wherein the capacitances are formed between the aluminum layer and the polysilicon layer and between the polysilicon layer and the diffusion regions such that the capacitances are in the ratio of C-2C or 1 to 2. In addition, trimming networks are provided which comprise a series of parallel capacitors formed by the diffusion regions in the substrate and the polysilicon layers. After the capacitor ladder network has been manufactured using monolithic, integrated circuit techniques, the trimming capacitors can be connected or disconnected using a laser technique to electrically trim the capacitor ladder network.

Also, as described in the above-referenced Cook and Schuster application, the D/A converter forms an integral part of an A/D converter wherein an analog output voltage $V_o$ of the capacitor ladder network is supplied as one input to a comparator. The other input to the comparator is the analog input voltage which it is desired to convert to a digital output. The output of the comparator either enables or inhibits an AND gate. A source of clock pulses is connected to an input of the AND gate which, when enabled by the comparator, passes the clock pulses to a counter. The stages of the counter are connected to the gates of the corresponding FET switch pairs which in turn are connected to charge or discharge a capacitor C, thereby completing a feedback loop. The output of the counter is also the digital output of the A/D converter.

Since one of the most important functions in the quantization of analog signals is the comparison of two voltage levels, an essential component of an A/D converter is the comparator circuit. An ideal voltage comparator would be a device with zero voltage and current offsets, infinite input impedance, infinite gain, and infinite bandwidth.

SUMMARY OF THE INVENTION

It is an object of the present invention to provide a comparator having offset voltage generating means to compensate for device variations in such comparator. It is another object of the present invention to provide a comparator for a C-2C network of an A/D converter with relatively high speed and which compensates for latch offsets resulting from device and waveform tolerances. It is another object to provide a comparator for a C-2C network of an A/D converter which has relatively high input impedance, gain and bandwidth. These and other objects are achieved by the present invention which provides a comparator circuit for comparing two voltage levels in a C-2C A/D and D/A converter, comprising four cross-coupled active devices (FETs) in a latch arrangement whereby an offset voltage is used to compensate for imbalances in the comparator. In one embodiment, the comparator includes a first FET having its gate electrode connected to the output of the D/A converter, and a second FET having its gate electrode connected to an analog input voltage. The first and second FETs each have one of their electrodes connected to a common voltage source. A third and a fourth FET have one of their electrodes connected respectively to the other electrode of the first and second FETs at first and second common nodes, respectively. The output of the comparator is provided at one of such first and second common nodes. The first and second nodes are also respectively connected to the gate electrodes of the fourth and third FETs in a cross-coupled arrangement. The other electrode of both the third and fourth FETs are connected to a common phase voltage source. An offset voltage is generated at the input to either of the gate electrodes of the first and second FETs to set the comparator at a balance point and thereby compensate for the differences in the threshold voltages and current carrying capabilities of the four FETs. Also, the comparator has relatively high input impedance, gain and bandwidth.

According to a first method of generating the offset voltage for the latch comparator, a plurality of compensation voltages are determined over a full range of analog input values $V_a$ and stored. By this first method, the offset voltages can be generated in either a digital or analog fashion and the appropriate voltage used during a comparator operation. According to a second method, the output $V_o$ of the D/A converter is subtracted from the analog input signal $V_a$ at a single node such that the comparison is always carried out at the same voltage level, and thereby requires storage of a single offset compensating value. This second method is carried out by either digital or analog means.

In one embodiment of the second method, a small offset voltage is produced at the gate electrode of the second FET. The offset voltage is used to set the comparator latch at its balance point. Specifically, the output voltage of the D/A converter is subtracted from the analog input voltage and applied to the gate electrode of the first FET, and the analog offset voltage is applied via another C-2C network and D/A converter to the gate electrode of the second FET.

In another embodiment of the second method, instead of the analog offset voltage being derived from the output of a separate D/A converter, the offset voltage is supplied from the same D/A converter that provides the input voltage at the gate electrode of the first FET. This offset voltage was previously determined and stored in digital form before being supplied to the D/A converter.

DESCRIPTION OF THE PREFERRED EMBODIMENTS

Figure 1:
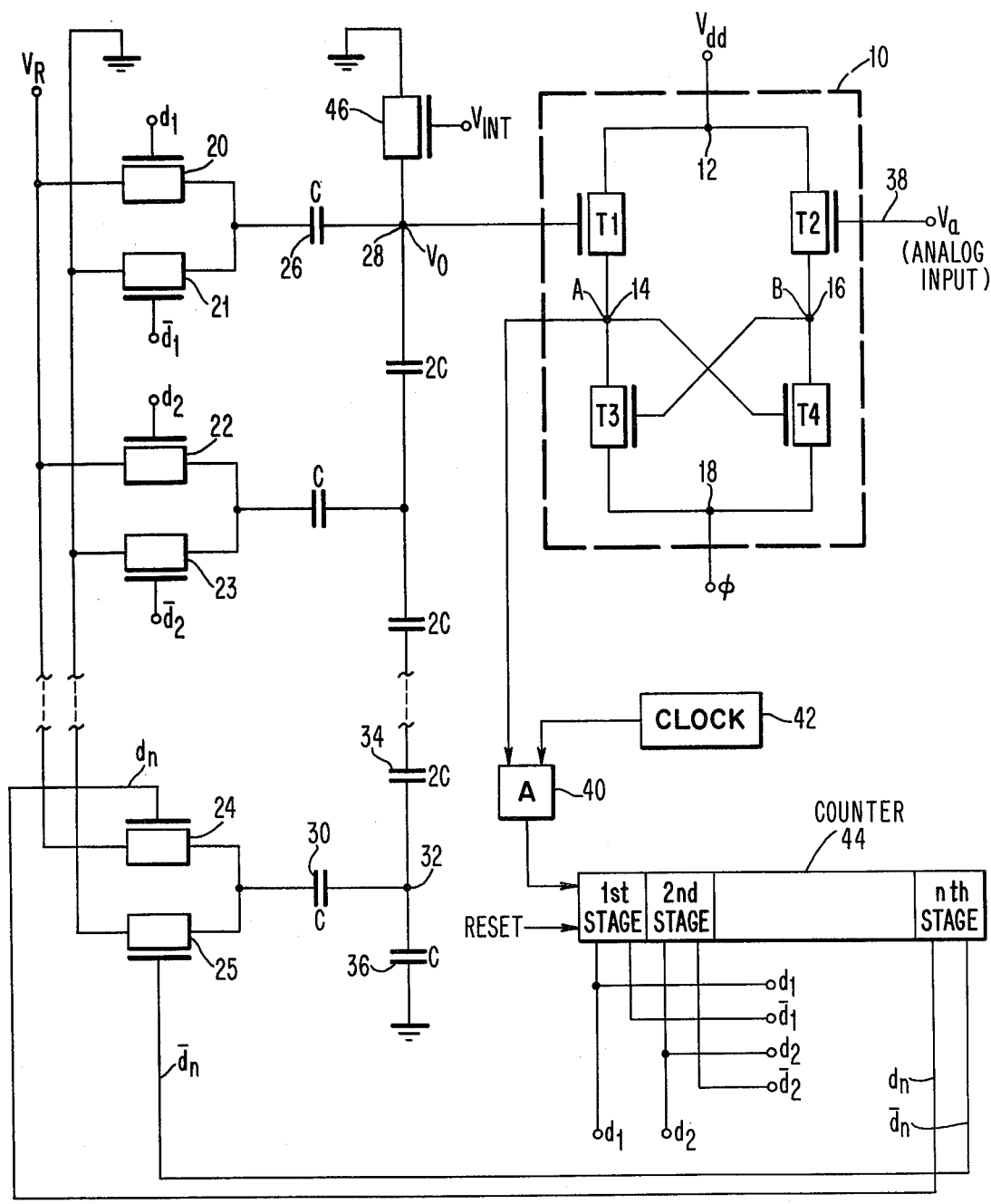
FIG. 1 is a circuit diagram of the comparator connected in the C-2C network, illustrative of the present invention.
Figure 2:
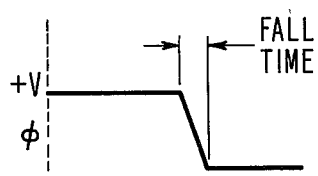
FIG. 2 shows the phase voltage waveforms applied to the comparator of FIG. 1.

Referring to FIG. 1, there is shown the comparator circuit for the C-2C network used in an A/D converter. The comparator circuit, indicated generally by numeral 10, comprises four active devices (FETs) T1, T2, T3 and T4. FETs T1 and T2 have one of their electrodes connected to a common node 12 while the other of their electrodes are connected, respectively, to the electrodes of FETs T3 and T4, respectively, at common nodes 14 and 16. For purposes of simplifying the description of the comparator 10, the nodes 14 and 16 will also be referred to as nodes A and B, respectively. The other electrodes of FETs T3 and T4 are connected to a common node 18. Node A is connected to the gate electrode of FET T4, while node B is connected to the gate electrode of FET T3. A source, indicated by $V_{dd}$, provides a voltage to the common node 12. A pulsed source, indicated by $\phi$, provides a phase voltage at node 18. The phase voltage provided by pulsed source $\phi$ is shown by the waveform of FIG. 2.

In the operation of the comparator circuit 10 shown in FIG. 1, $V_{dd}$ charges nodes A & B of the latch towards $V_o$-$V_{T1}$, and $V_a$-$V_{T2}$, respectively, where $V_{T1}$ and $V_{T2}$ are the threshold voltages of FETs T1 and T2, respectively. Since $\phi$ is high during this time, devices T3 and T4 are off, except for the case where there is more than a threshold voltage difference between $V_o$ and $V_a$. For this case, because of the large voltage difference between nodes A and B, either device T3 or T4 will turn on until the voltage difference is reduced to a threshold voltage. This voltage difference is still large and relatively easy for the comparator to detect. A more challenging problem is the one where the voltage levels ($V_o$ and $V_a$) are close together. For this case, when $\phi$ goes low, nodes A and B will start to discharge when the $\phi$ voltage equals $V_a$-$V_{T2}$-$V_{T3}$ and $V_o$-$V_{T1}$-$V_{T4}$, respectively. If the fall time of the phase voltage clock $\phi$ was very long, only the threshold would determine which way the latch would switch. With short fall times, the device current carrying capabilities and capacitances must be included. Depending on which node (A or B) discharges faster, the comparator will reach a state with one node a threshold voltage lower than its input gate and the other node at approximately the down level of $\phi$.

Figure 3:
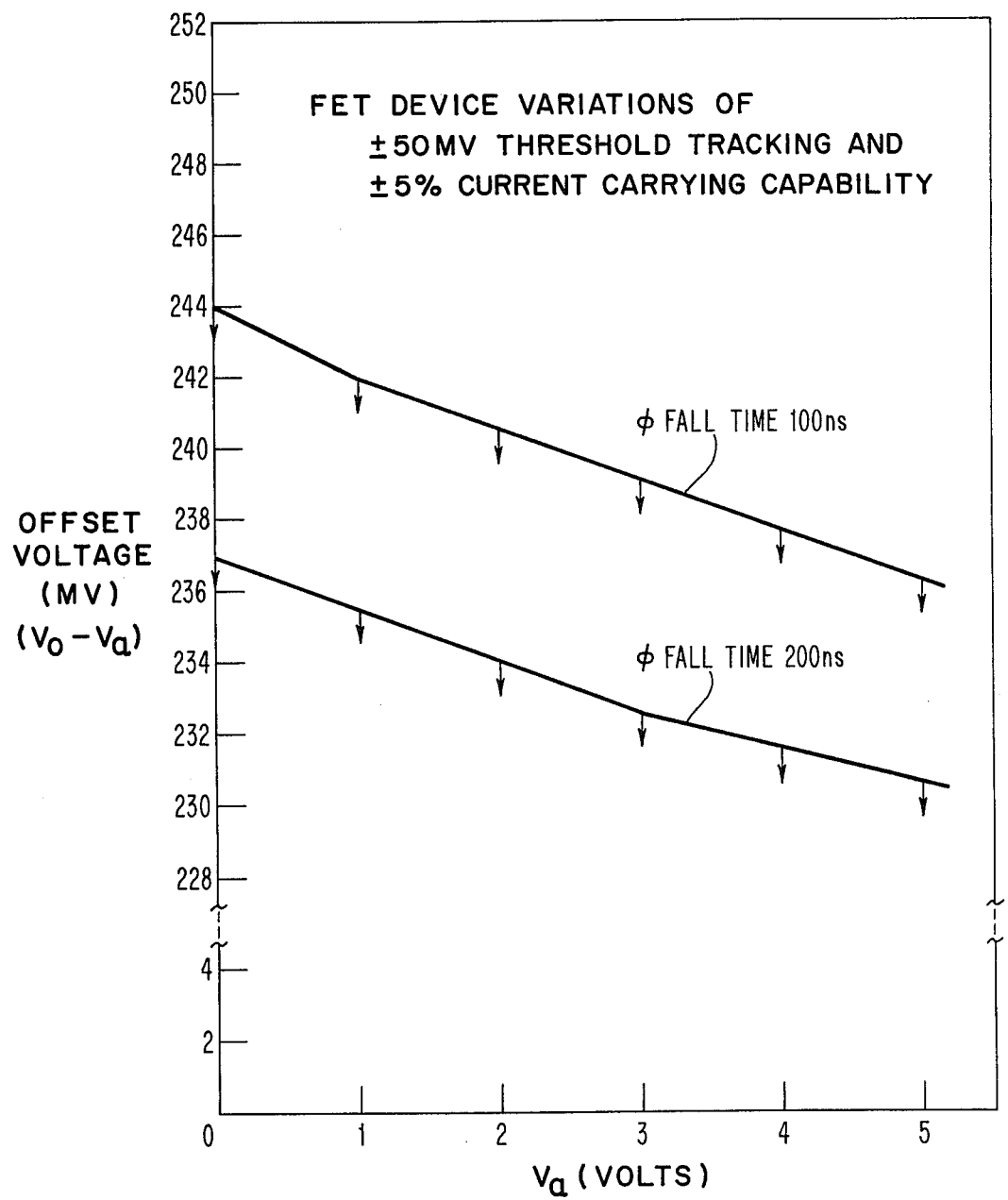
FIG. 3 is a graph of the offset voltage versus the analog input voltage for two different fall times of one input phase voltage.

It should be apparent from the description thus far that it is not only the difference in the input voltages $V_o$ and $V_a$ which determine the final state of the comparator 10, but also the differences in the threshold voltage and current carrying capabilities of the various devices. When these effects are included in the comparator circuit an offset voltage is needed to achieve a reasonable degree of accuracy. The transfer characteristic showing the offset calibration voltage (i.e., $V_o$-$V_a$) over the entire analog input voltage $V_a$ range is shown in FIG. 3 for the worst case device variations. These variations were chosen to "worst case" the latch imbalance. Specifically, FIG. 3 is a plot of offset voltage over analog input voltage level for phase fall times of 100 nanoseconds and 200 nanoseconds where the FET devices had variations of ± 50 millivolt threshold tracking and ± 5 percent current carrying capability.

Figure 1A:
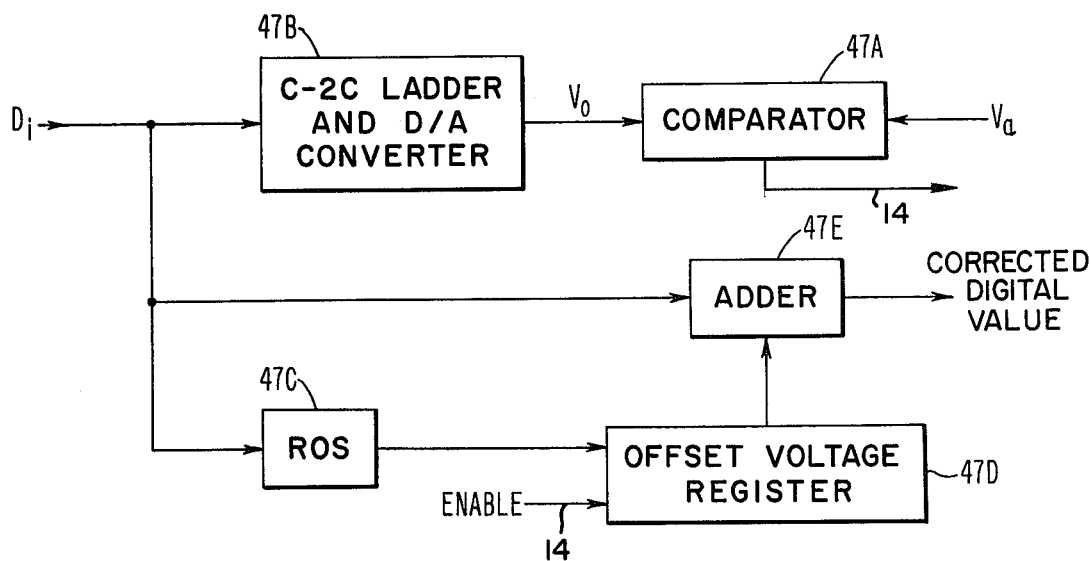
FIGS. 1A, 1B, 1C and 1D are general block diagrams of circuits used for applying the appropriate offset voltages to the comparator operation.
Figure 1B:
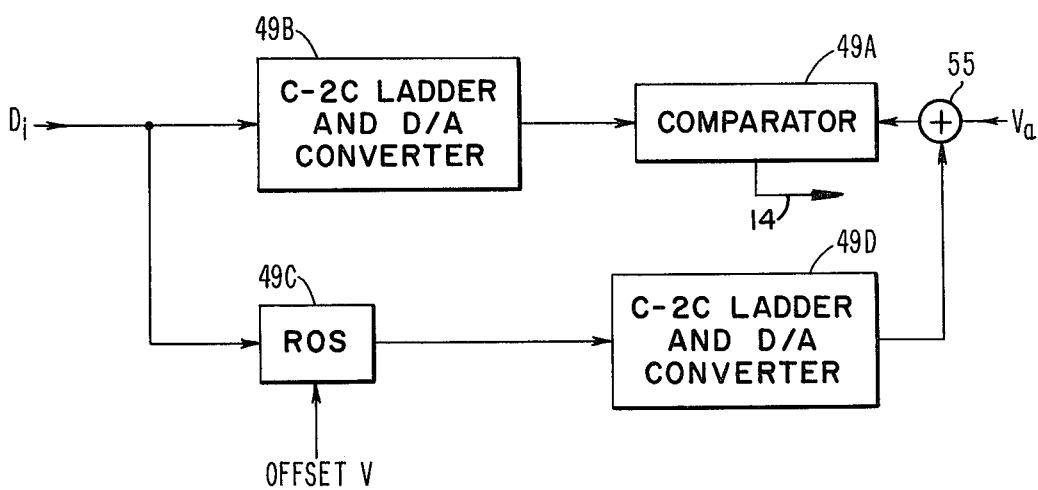

The present invention provides means by which the latch comparator may be compensated for its offset characteristics, thereby providing increased accuracy and linearity of A to D conversion. According to a first method of generating the offset voltage for the latch comparator, a plurality of compensation voltages, typified by the offset characteristic of FIG. 3, are generated over a full range of analog input values $V_a$. By this first method, the offset voltage can be generated in either a digital fashion, as generally illustrated in FIG. 1A, or in analog fashion as generally illustrated in FIG. 1B. As shown in FIG. 1A, a comparator 47A compares the analog voltage $V_a$ with the output voltage $V_o$ of a C-2C ladder network and D/A converter circuit 47B, the latter circuit being shown and described in detail with respect to FIG. 1. The digital input $D_i$ to circuit 47B is also provided to a read-only store (ROS) 47C. It is to be understood that the digital input $D_i$ shown in FIGS. 1A, B, C and D is the term used to generally indicate the digital outputs $d_1, d_2, \ldots d_n$ of the counter 44 shown and described with reference to FIG. 1.

The ROS 47C is a conventional read-only store (ROS), also known as a read-only memory (ROM), such as that described and shown by Drs. William N. Carr and Jack P. Mize in their book entitled MOS/LSI Design and Application (Texas Instrument Series-McGraw Hill 1972) at pages 196–206. The ROM, for example, at FIG. 7.8, takes a binary code or address at its input terminals and provides a unique binary code or address on its output terminals. The read-only store 47C is programmed to store the range of offset values, such as shown in the curves of FIG. 3, so that for every digital code applied to its input, at its output it provides an offset voltage which is stored in an offset voltage register 47D which is enabled when a match occurs in the comparator 47A via the comparator output at line 14. Both the register 47D and the digital input $D_i$ are provided to an adder 47E. In the operation of the circuit of FIG. 1A, comparisons are made over the full range of the analog input voltage $V_a$. At each input voltage, when a match occurs, the read-only store 47C provides the stored offset voltage, which was previously determined for that input voltage level, to the register 47D which then adds such offset voltage to the digital input $D_i$ in the adder 47E. As described below in the detailed description of FIG. 1, the digital input $D_i$ is provided from the output of the counter 44 to a C-2C ladder network and D/A converter and applied as an analog voltage $V_o$ at node 28 as one input to the comparator 10.

The other input to the comparator 10 is the analog input $V_a$. Thus, the corresponding digital value $D_i$ is provided which represents the value of the analog input $V_a$ when the comparator 10 produces a match at its output 14. The digital offset, when added to the input $D_i$, provides the digital value of the unknown analog voltage $V_a$ at the output of adder 47E.

In the functional block diagram shown in FIG. 1B, the offset voltage is generated in digital fashion over the full range of the input voltages, prior to being added in analog form to the analog voltage $V_a$. Here, a comparator 49A receives the input analog voltage $V_a$ together with the output of a C-2C and D/A converter 49B. The input $D_i$ to the D/A converter 49B is also applied to a read-only store (ROS) 49C. It is to be understood, of course, that ROS 49C contains a plurality of digital offset values which were previously determined for known analog inputs $V_a$ over a wide range of values. For every binary code presented at the input to the ROS 49C, a binary code is provided at its output which represents the offset value that has been predetermined and stored in the ROS for the particular digital input $D_i$. In this manner, the ROS 49C, as well as the ROS 47C shown in FIG. 1A, act in the conventional manner of receiving a binary code at its input terminals and providing a unique binary code on its output terminals in accordance with the programming of the particular ROS. The output of ROS 49C is converted into analog form by a C-2C D/A converter 49D and added by adder 55 to the analog input $V_a$. Thus, in both of the offset generating means shown in FIGS. 1A and 1B, the offset voltage is generated over a full range of analog input values with FIG. 1A providing a digital offset which is added or subtracted to the digital input $D_i$ while the FIG. 1B provides an analog offset which is added to the analog input voltage $V_a$.

Figure 1C:
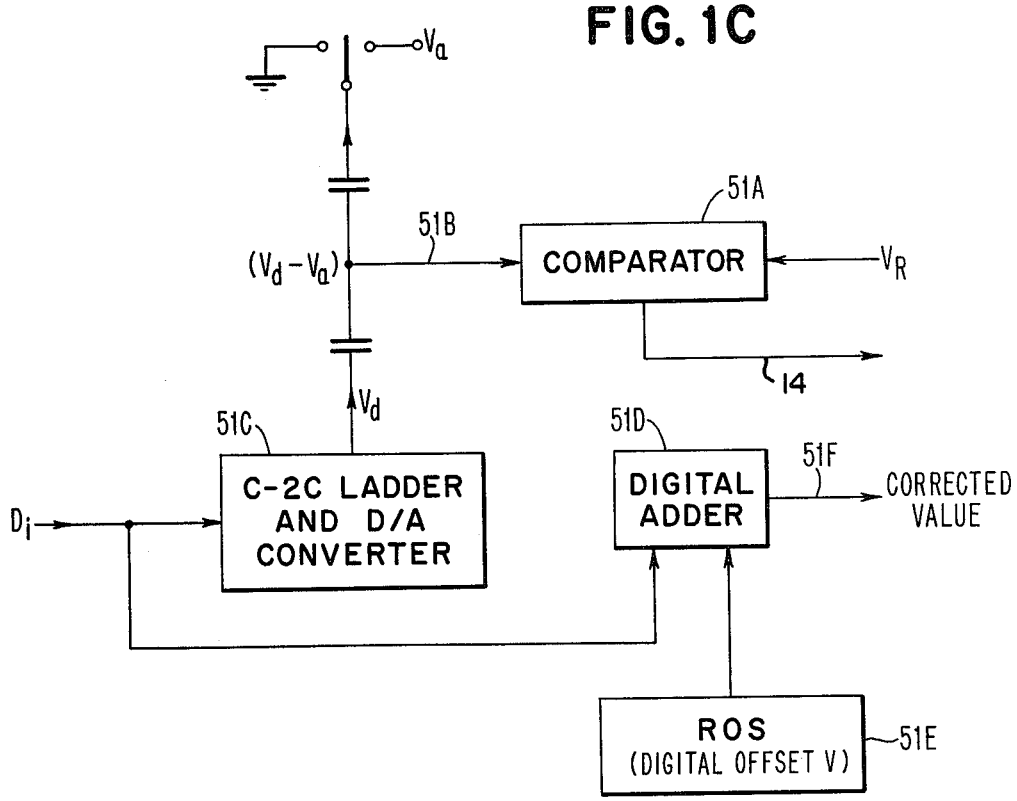
Figure 1D:
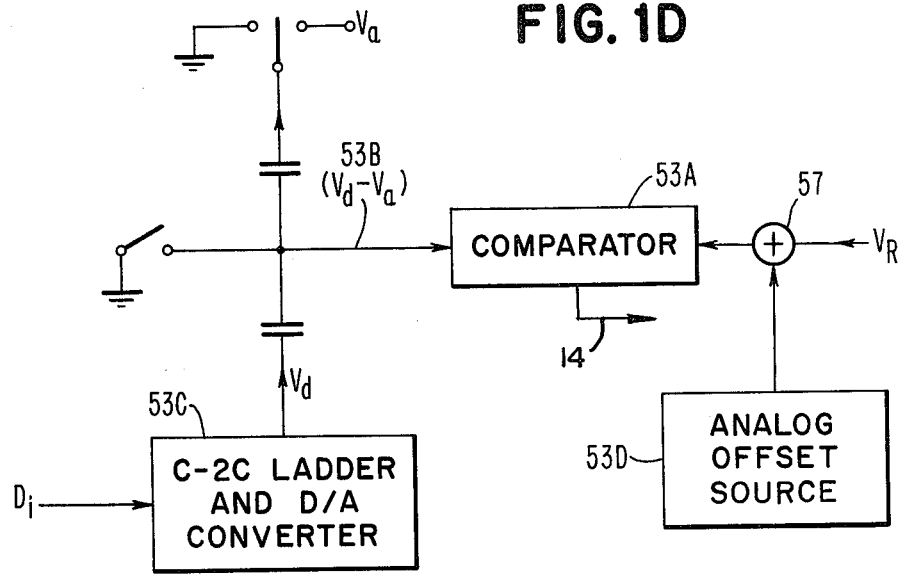

FIGS. 1C and 1D are block circuit diagrams illustrating the second method by which the latch comparator may be compensated for its offset characteristics, this second method being characterized by subtracting the output $V_d$ of the D/A converter from the analog input signal $V_a$ at a single node such that the comparison is always carried out at the same voltage level, resulting in a single offset compensating value. It is to be understood that as used herein, the terms $V_d$ and $V_o$ shown in the FIGS. 1, 1A, 1C, 1D, 3, 4B and 5 are used generally denote the output of the D/A converter. This second method is carried out by digital means in the circuit shown in FIG. 1C and by analog means in the circuit shown in FIG. 1D.

Referring to FIG. 1C where the correction is accomplished via digital logic, a latch comparator 51A receives a reference voltage $V_R$ and a difference voltage on line 51B which is the difference between the output $V_d$ of a C-2C D/A converter 51C and an analog input voltage $V_a$. As described with reference to FIG. 1 and 1A, the digital value $D_i$ is produced by the counter 44 and represents the value of the analog input $V_a$ when the comparator 10 produces a match at its output 14. The digital input voltage $D_i$ is applied to both the D/A converter 51C and to a digital adder 51D which adds this to the output from a read-only store (ROS) 51E. ROS 51E holds the digital offset voltage which was previously determined. The corrected digital value representative of the unknown analog voltage $V_a$ is provided at the output line 51F of the digital adder 51D. In this fashion, a constant offset voltage is added to the digital input $D_i$ to provide a corrected digital value for the unknown analog input voltage $V_a$.

Referring to FIG. 1D, there is shown a block diagram illustrating the method of generating a single analog offset voltage for all comparisons since they are always carried out at the same voltage level. It is noted that the circuits shown in FIGS. 4A and 5 also utilize this approach. As in the FIG. 1C, the circuit of FIG. 1D also provides a comparator 53A which compares a fixed input reference voltage $V_R$ with a differential voltage on input line 53B representing the difference between the analog output voltage $V_d$ from a C-2C and D/A converter 53C and an analog input voltage $V_a$. The digital input to the converter 53C is similarly shown by $D_i$. It is noted here as in the previous FIG. 1C that the reference voltage $V_R$ is always held at a constant level. An analog offset source 53D provides the previously determined analog value of the offset voltage and supplies it at the appropriate time to the input reference voltage where it is added by adder 57 thereto. In this fashion, compensation can be provided over a full range of input voltages while using a constant analog offset voltage provided to the comparator 53A. In this connection it is noted that FIG. 4A also provides an analog offset voltage, but does this through a separate C-2C converter. By contrast, in the circuit of FIG. 5, the analog offset voltage is provided through a D/A converter. The specific details of the circuits of FIGS. 4A and 5 will be described below.

Referring again to FIG. 1, the comparator 10 of the present invention generates an offset voltage to compensate for the differences in the threshold voltages and current carrying capabilities of the various active devices of the comparator or latch. An unknown analog voltage is applied and compared with the output voltage, $V_o$, of the D/A converter circuit and an offset calibration voltage $V_o$-$V_a$ is derived at one of the nodes A and B of the latch in order to set the latch at its balance point. It has been found that the comparator 10 can use a small stored digital offset to achieve accuracies of about 1 millivolt over a 5 volt analog input range. High performance (200–400 n sec) results because of regenerative loop gain during switching. The comparator also is characterized by a high input impedance (i.e., $> 10^{14}$ ohms), high gain and high bandwidth.

The A/D and D/A converters employing the capacitor ladder network described herein as an example of one type of converter to be used herein is described in the above-referenced U.S. Patent Application Ser. No. 585,629. More particularly, the ladder network comprises a plurality of field effect transistor (FET) switch pairs 20-21, 22-23 and 24-25. One of each FET switch pair is connected in common to a reference voltage $V_R$ while the other FET of the switch pair is connected in common to ground potential. The FET switch pairs are connected to charge or discharge a capacitor having a capacitance C. Each of the capacitors having a capacitance value C, except the first and the last, are connected to a corresponding junction between a plurality of series capacitors having a capacitance value 2C. The first capacitor 26 having a capacitance C is connected to an output junction or node 28 at which an analog output voltage $V_o$ is developed. The last capacitor 30 having a capacitance value C is connected to the junction 32 between a capacitor 34 of capacitance value 2C and a capacitor 36 of capacitance value C, the latter being referenced to ground. The gate electrodes of the FET switch pairs are controlled by the true and complement outputs of a source of binary signals, and these outputs are designated, respectively, $d_1-\bar{d}_1, d_2-\bar{d}_2, \ldots, d_n-\bar{d}_n$.

The structure thus far described, except for the comparator 10, constitutes a D/A converter. More particularly, if an independent source of digital signals constituted by the digits $d_1, d_2, \ldots, d_n$ is connected to the FET switch pairs, the corresponding analog output voltage $V_o$ will be developed at the output junction or node 28 of the capacitor ladder network. The basic transfer junction of this D/A converter under ideal conditions is as follows: $V_o = V_R(d_1 2^{-1} + d_2 2^{-2} + \ldots + d_n 2^{-n})$, where $d_i$ are zero or one depending on the digital inputs.

The D/A converter forms an integral part of an A/D converter as shown in FIG. 1 where the analog output voltage $V_o$ of the capacitor ladder network is supplied as one input to the comparator 10 at the gate electrode of FET T1. The other input to the comparator 10 is the analog input voltage $V_a$ which it is desired to convert to a digital output. Analog input voltage $V_a$ is applied on line 38 to the gate electrode of FET T2. The output of comparator 10 is provided at node 14 and connected to either enable or inhibit an AND gate 40. A source 42 of clock pulses is connected to an input of AND gate 40 which, when enabled by the comparator 10, passes the clock pulses to a counter 44. The stages of counter 44 are connected to the gates of the corresponding FET switch pairs, thereby completing a feedback loop, as shown. The output of counter 44 is also the digital output of the A/D converter.

In operation, counter 44 is initially reset so that all $d_i$ are zero, and the analog output voltage of the capacitor ladder network $V_o$ is set to ground by gating at FET 46 on with an initialization pulse $V_{int}$. The purpose of FET 46 is to permit both initialization and calibration of the capacitor ladder network. The output node 28 ($V_o$) of the capacitor ladder network must start at some fixed voltage for each A/D and D/A conversion. Leakage currents at this node 28 can cause the voltage to drift slowly with time unless the node is connected to a fixed voltage at certain time intervals. Thus, each conversion is preceded by raising the voltage $V_{int}$ thereby grounding $V_o$. Moreover, once the output node 28 of the capacitor ladder network has been initialized, any initial conditions on the intermediate nodes between the series capacitors having capacitance values 2C have no effect on the final output voltage which is only a function of changes in voltage in the network that occur after the initialization.

The A/D converter described above employs a count up algorithm. It should be evident to those skilled in the art that the C-2C network is equally applicable to other A/D conversion algorithms (for example, binary search) with suitable modification of the control and clocking.

Figure 4A:
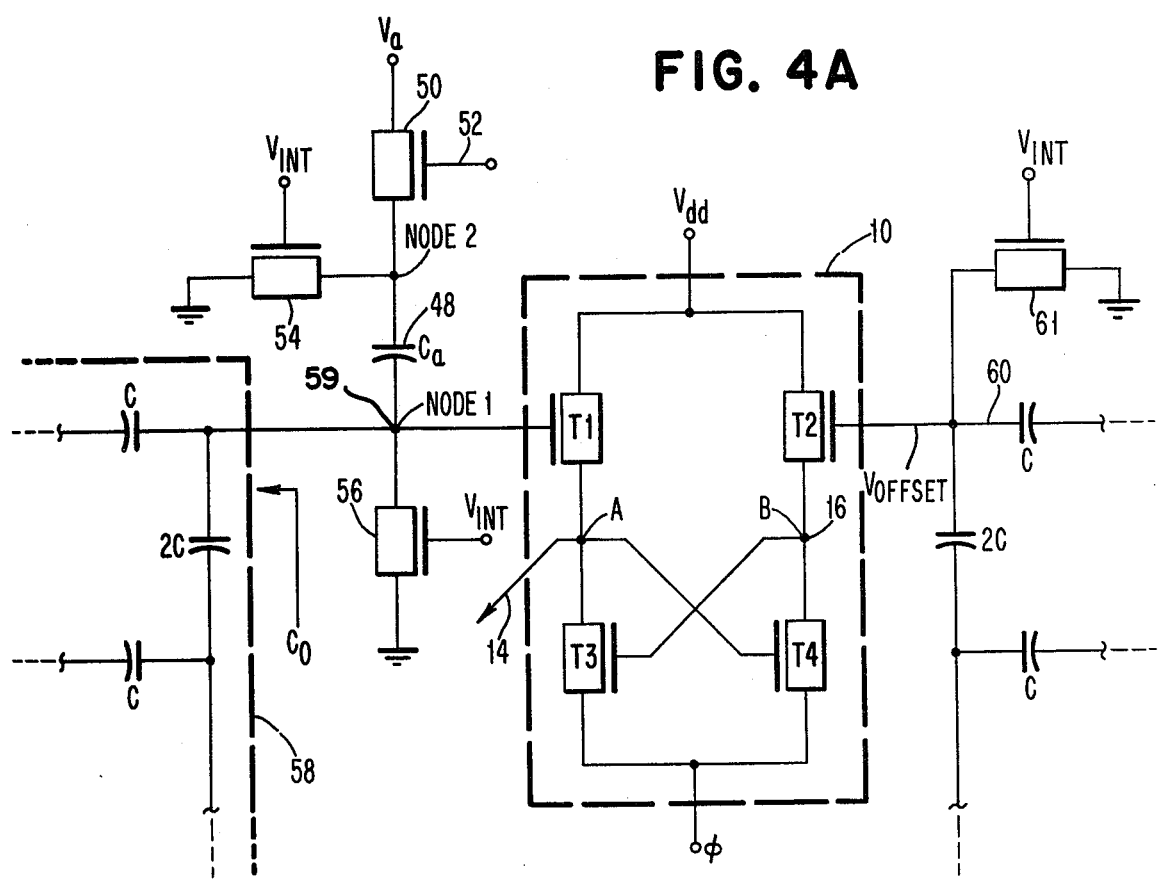
FIG. 4A shows one embodiment of the circuitry for generating the offset voltage for the comparator.

Referring to FIG. 4A, there is shown another approach wherein the output $V_o$ of the D/A converter is subtracted from the analog input signal $V_a$ such that the comparison is always carried out at the same voltage level. This also makes it possible, as shown in the figure, to add an analog offset to the latch to compensate for imbalance at the switching point. Specifically, the analog voltage $V_a$ is applied to a capacitor 48, hereinafter also referred to as $C_a$, through a FET device 50 which receives a gating voltage at its gate 52. Capacitor $C_a$(48) is also connected to a FET 54 which is grounded by initialization voltage $V_{int}$. Node 60 is similarly initialized by FET 61. For purposes of describing FIG. 4A, the gate of FET T1 is indicated by both node 1 and numeral 59 and connects with both the output of the D/A converter and to a FET 56 which receives an initialization voltage $V_{int}$ at its gate for grounding the node 1. The common node of capacitor $C_a$(48) and FETs 50 and 54 is indicated by node 2. Node 1 is the output point for C-2C network 58, which can be the same or similar to the network shown in FIG. 1. In operation, prior to an A/D conversion, $V_{int}$ is used to initialize nodes 1 and 2 to ground potential. Then the binary input signal is applied to the C-2C network 58 at the same time that the analog voltage $V_a$ is applied to the input of $C_a$ (48) through FET device 50. The voltage at node 1 is defined as follows:

$$V_{N1} = V_a \frac{C_a}{C_a + C_0} - V_0 \frac{C_o}{C_a + C_o} \qquad 1)$$

If the switching point is chosen with the node 1 at ground potential, then:

$$V_A = \frac{C_o}{C_a} V_o \qquad 2)$$

where $C_o$ represents the equivalent capacitance when looking into the C-2C network 58.

Figure 4B:
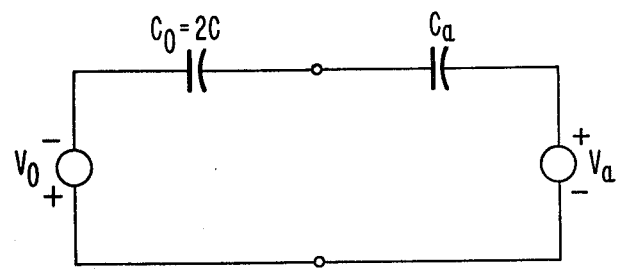
FIG. 4B shows the Thevenin equivalent circuit for the capacitor ladder network shown in FIG. 4A.

FIG. 4B is a circuit diagram of the Thevenin equivalent circuit for the capacitor ladder network shown in FIG. 4A. Then, if $C_a$ is adjusted to equal $C_o$, the desired result is achieved.

$$V_a = V_o \qquad (3)$$

A few stages of another C-2C network and the trimming technique described in the above described Patent Application Ser. No. 585,629 can be used to supply at circuit point 60 the analog offset voltage to the comparator 10.

Figure 5:
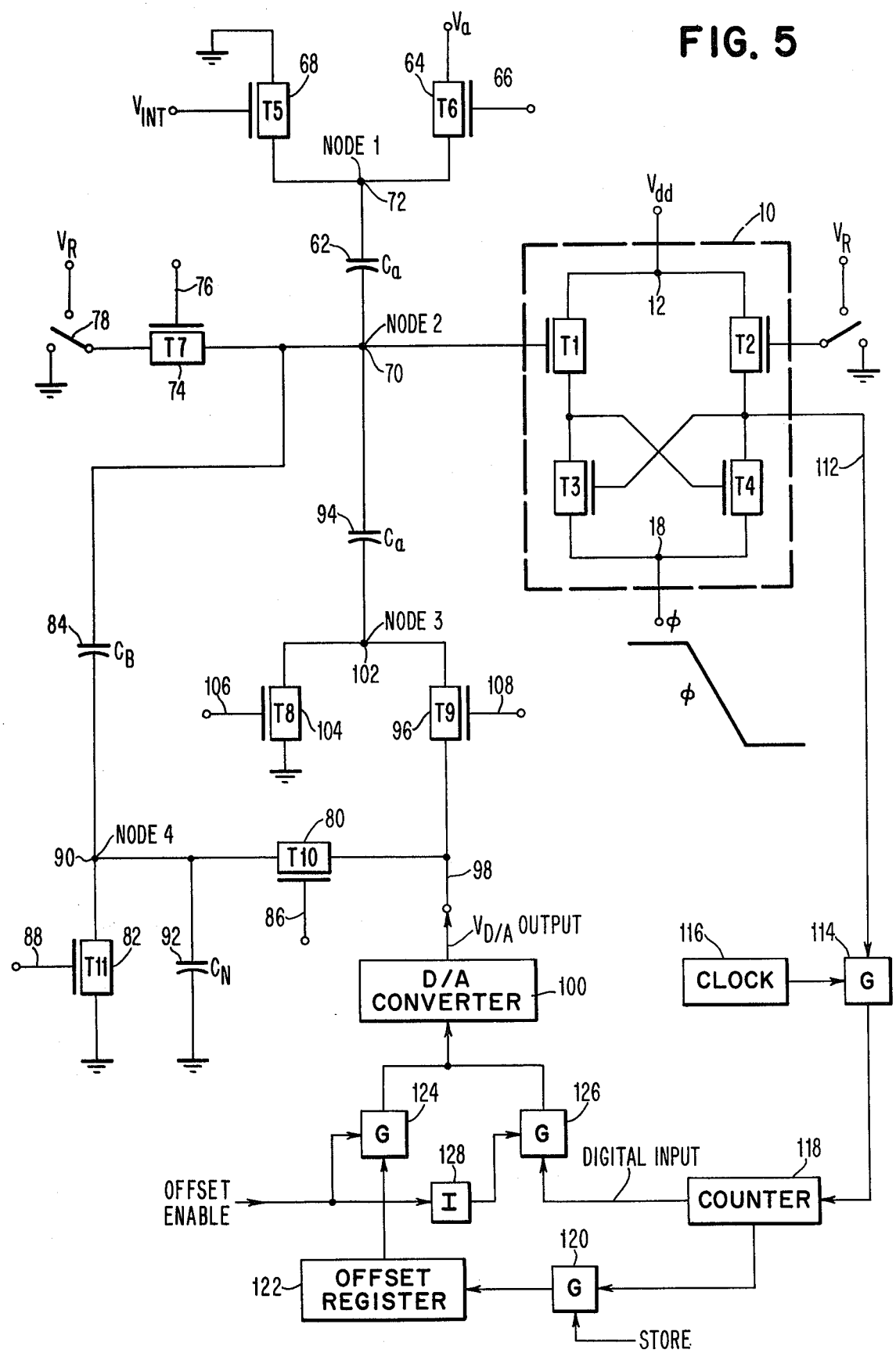
FIG. 5 shows another embodiment of the circuitry for generating the offset voltage for the comparator.

In the comparator circuit 10 described above, a small offset voltage is used to achieve an accuracy of less than one millivolt over a five volt analog input range. The comparator 10 has a high input impedance, is relatively insensitive to device parameters and geometrical variations, is very fast (200–400 $n$ sec), and generally simple. FIG. 5 shows a simple method of generating the offset voltage for the comparator. In FIG. 5 the circuit diagram of the comparator 10 is shown. As previously described, the offset voltage was applied to the gate of FET T2 so that the cross-coupled latch would be balanced with no input (i.e., ground) applied to the gate of FET T1. Also, in the circuit embodiment of FIG. 4A, the offset voltage was derived from the output of a separate D/A converter. In the circuit configuration shown in FIG. 5, the offset voltage is supplied by the same D/A converter that is used to generate the voltage level which is compared to the unknown analog signal in the manner to be described below.

Figure 6:
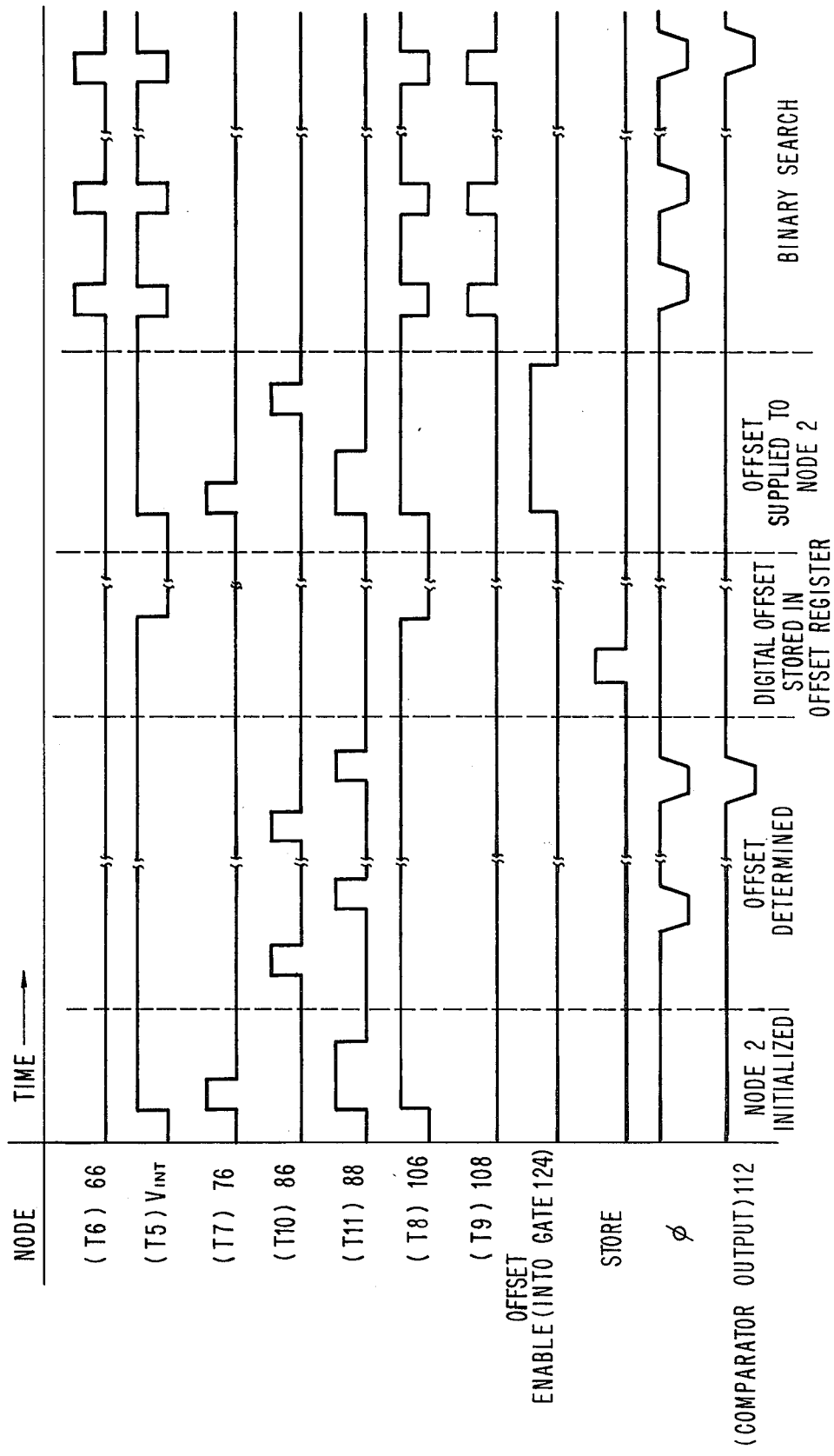
FIG. 6 is a timing diagram for the circuit of FIG. 5.

Referring again to FIG. 5, there is shown the circuit for generating the offset voltage for the comparator 10 a timing diagram is shown in FIG. 6 for the circuit of FIG. 5. Specifically, the analog voltage $V_a$ is applied to a capacitor 62, hereinafter also referred to as $C_a$, through a FET device 64 (T6) which receives a gating voltage at its gate 66. Capacitor $C_a$ (62) is also connected to a FET 68 (T5) which is grounded by initialization voltage $V_{int}$. For purposes of describing FIG. 5, the gate of FET T1 is indicated by both numeral 70 and node 2, and the common node of capacitor $C_a$ (62) and FETs 64 (T6) and 68 (T5) is indicated by both numeral 72 and referred to as node 1. FETs T5 and T6 and capacitor $C_a$ (62) in FIG. 5 are similar in function and operation to the FETs 50 and 54 and capacitor $C_a$ (48) shown in FIG. 4A.

Node 2 is connected to a FET 74 (T7) which receives a gating voltage at its gate 76 to apply a ground or reference voltage $V_R$ via switch 78. Node 2 is also connected to FETs 80 (T10) and 82 (T11) via a capacitance $C_B$, indicated also by numeral 84, with both T10 and T11 being gated at 86 and 88, respectively. FET T11 is connected at one electrode to ground. The common node of T10, T11 and capacitor 84 ($C_B$) is indicated by 90 and referred to as node 4. Node 4 is connected via a capacitor 92 ($C_N$) to ground.

Node 2 is also connected via a capacitor 94 ($C_a$) and a FET 96 (T9) to the output 98 of a D/A converter 100. Converter output 98 is also connected to FET 80 (T10). The connection of FET 96 (T9) and capacitor 94 ($C_a$) indicated by 102 and referred to as node 3, is also connected to a FET 104 (T8) which is gated at 106 to ground. FET T9 receives a gating voltage at its electrode 108.

In operation, FET T7 is turned on and off initializing node 2 to ground potential or to some reference voltage $V_R$ minus some parasitic coupling voltage. FETs T5, T8 and T11 are turned on during this operation. Next, by means of a counter 118 via a gate 126, the offset voltage needed to balance the latch is determined by switching node 4 from ground to the D/A converter output voltage on line 98 through FETs T10 and T11 until balance is achieved. This offset voltage appears on node 2. The value of $C_B$ is not critical. The voltage coupled to node 2 from node 4 is approximately $$V_{D/A} \frac{C_B}{C_B + 2C_a}.$$

Making $C_B$ small attenuates the D/A converter output at node 2 so that a much finer resolution in the offset voltage can be achieved. During this operation, FETs T5 and T8 are turned on connecting nodes 1 and 3 to ground while FET T7 is off allowing node 2 to float. In switching from ground potential to the D/A converter output through FETs T10 and T11, T11 which was on is turned off first, and then FET F10 is turned on allowing node 4 to charge to the voltage output of the D/A converter. Then FET T10 is turned off again so the voltage on node 4 is the converter output voltage minus the switching parasitics. Lastly, the comparator clock $\phi$ falls, making the comparison. This sequence eliminates the effects of the device parasitics on the offset voltage which is now on node 2. It is noted that the clock $\phi$ is applied at common node 18 of comparator 10 while a source voltage $V_{dd}$ is applied at the common node 12. Also, the output line 112 of comparator 10 is gated by AND gate 114 and clock 116 to counter 118 which inputs the D/A converter 100 in the manner described with reference to FIG. 1.

Once the offset voltage has been determined, the digital input from the counter 118 to the D/A converter 100 which gave the required offset can be stored via gate 120 in an offset register 122. Prior to doing a comparison, node 2 will be initialized by the above-described procedure and then the offset will be supplied to node 2. The offset voltage is generated in one operation by activating the offset enable to a gate 124 to allow the required digital input stored in offset register 122 to be entered into the D/A converter 100. The offset enable is also connected to gate 126 via an inverter 128 so that only one of the two gates 124 and 126 is enabled at the same time. Now, a binary search is performed via gate 126 on the unknown analog voltage by bringing some fraction, determined by the capacitance ratios, of the analog voltage into node 2 by turning off FET T5 and turning on FET T6. At the same time, the output voltage of the D/A converter 100, determined by the contents of counter 118, is brought into node 2 by turning off FET T8 and turning on FET T9. When the voltages on nodes 1 and 3 are of the same magnitude, but opposite sign, there will be no change in voltage at node 2 and the comparator 10 will be at the balance point. If the voltages are not equal, some fraction of their difference or sum determined by the capacitances on node 2 will be superimposed on the offset voltage and the comparator 10 will latch in the appropriate direction. Again, the effect of parasitics have been cancelled, since only the difference between the initial and final voltages of nodes 1 and 3 are of interest, not the switching transients.

Although the above description is directed to preferred embodiments of the invention, it is noted that other variations and modifications of the comparator circuit will be apparent to those skilled in the art and, therefore, may be made without departing from the spirit and scope of the present disclosure.

What is claimed is:

1. A comparator circuit for comparing voltage levels in a digital-to-analog (D/A) converter, comprising:

a first field effect transistor (FET) having a gate and first and second electrodes, with its gate connected to the output of the D/A converter:

a second field effect transistor (FET) having a gate and first and second electrodes, with its gate connected to an analog input voltage, said first and second FETs each having their first electrode connected to a common voltage source;

a third FET having a gate and first and second electrodes, with its first electrode connected with the second electrode of said first FET at a first common node;

a fourth FET having a gate and first and second electrodes, with its first electrode connected with the second electrode of said second FET at a second common node, said second node being also connected to the gate of said third FET, said first node being also connected to the gate of said fourth FET, and said third and fourth FETs each having its second electrode connected to a common phase voltage source;

said digital-to-analog converter having an input and an output, with its output leading into the gate of said first FET and its input connected to respond to a means providing a digital representation of said analog input voltage which is connected to the output produced by said comparator at one of said common nodes; and means for generating an offset voltage which is used to compensate for the differences in threshold voltages and current carrying capabilities of said four FETs said means for generating an offset voltage including means for adding said offset voltage to said digital representation of said analog input voltage being compared;

whereby said four FETs included in said comparator circuit compare said analog input voltage with said output of said D/A converter and produces an output at either of said common nodes.

2. A comparator circuit as recited in claim 1, wherein said means for generating an offset voltage includes means for storing one or more offset voltages, and means for adding one of said stored offset voltages to the digital input to said digital-to-analog converter.

3. A comparator circuit as recited in claim 1, wherein the output of said digital-to-analog converter includes a C-2C type of ladder network.

4. A comparator circuit as recited in claim 1, wherein said means for generating an offset voltage includes means for storing a plurality of offset voltages for compensating for the comparator operation over a full range of input values to said comparator.

5. A comparator circuit as recited in claim 4, further comprising adder means connected to said storage means for adding an appropriate one of said stored offset voltages to a voltage being compared.

6. A comparator circuit as recited in claim 5, wherein said adder means is a digital adder.

7. A comparator system for comparing an input analog voltage with the output of a digital-to-analog (D/A) converter, comprising:
   comparator means having a first input and a second input, said second input being connected to a reference voltage;
   subtracting means for subtracting said output of said D/A converter from an analog input voltage, the resultant output of said subtracting means being connected to said first input to said comparator means;
   means for generating a single offset voltage for compensating for the operation of said comparator means over a full range of values of said input analog voltage; and
   adder means connected to said means for generating a single offset voltage for adding the generated offset voltage to a voltage being compared.

8. A comparator system as recited in claim 7, wherein said adder means is a digital adder connected to receive both the digital input to said D/A converter and said offset voltage.

9. A comparator system as recited in claim 7, wherein said adder means is an analog adder which adds an analog representation of said offset voltage to an analog input to said comparator means.

10. A comparator circuit for comparing voltage levels in a digital-to-analog (D/A) conveter, comprising:

a first field effect transistor (FET) having a gate and first and second electrodes, with its gate connected to the output of the D/A converter;
a second field effect transistor (FET) having a gate and first and second electrodes, with its gate connected to a reference voltage, said first and second FETs each having their first electrode connected to a common voltage source;
a third FET having a gate and first and second electrodes, with its first electrode connected with the second electrode of said first FET at a first common node;
a fourth FET having a gate and first and second electrodes, with its first electrode connected with the second electrode of said second FET at a second common node, said second node being also connected to the gate of said third FET, said first node being also connected to the gate of said fourth FET, and said third and fourth FETs each having its second electrode connected to a common phase voltage source;
said digital-to-analog converter having an input and an output, with its input connected to respond to the output produced by said comparator at one of said common nodes;
means for subtracting the output of said D/A converter from an analog input voltage which it is desired to convert to a digital output, and applying the difference to the gate of said first FET; and
means for generating an offset voltage which is used to compensate for the differences in threshold voltages and current carrying capabilities of said four FETs said means for generating an offset voltage including means for adding said offset voltage to a voltage being compared;
whereby said four FETs included in said comparator circuit compares said reference voltage with the difference between said analog input voltage and said output of said D/A converter and produces an output at one of said common nodes.

11. A comparator circuit as recited in claim 10, wherein said means for generating an offset voltage includes a second D/A converter.

12. A comparator circuit as recited in claim 10, wherein said means for generating an offset voltage includes means for storing a plurality of offset voltages for compensating for the comparator operation over a full range of input values to said comparator.

13. A comparator circuit as recited in claim 12, further comprising adder means connected to said storage means for adding an appropriate one of said stored offset voltages to the voltage being compared.

* * * * *